United States Patent
Iwasaki et al.

(10) Patent No.: US 6,242,110 B1
(45) Date of Patent: Jun. 5, 2001

(54) EPOXY RESIN COMPOSITION AND SEMICONDUCTOR DEVICE USING THE SAME

(75) Inventors: Shinichi Iwasaki; Masatoshi Iji; Yukihiro Kiuchi, all of Tokyo (JP)

(73) Assignees: Sumitomo Bakelite Company Limited; NEC Corporation, both of Tokyo (JP)

( * ) Notice: Subject to any disclaimer, the term of this patent is extended or adjusted under 35 U.S.C. 154(b) by 0 days.

(21) Appl. No.: 09/184,989

(22) Filed: Nov. 3, 1998

(30) Foreign Application Priority Data

Nov. 10, 1997 (JP) .................................................. 9-306847

(51) Int. Cl.$^7$ .................................................. H01L 29/12
(52) U.S. Cl. ............................................ 428/620; 523/424
(58) Field of Search ............................... 523/424; 428/620

(56) References Cited

U.S. PATENT DOCUMENTS

| | | | |
|---|---|---|---|
| 3,632,555 | * | 1/1972 | Harris et al. . |
| 5,298,548 | | 3/1994 | Shiobara et al. ...................... 523/443 |
| 5,312,878 | | 5/1994 | Shiobara et al. ...................... 525/507 |
| 5,358,980 | * | 10/1994 | Shiobara et al. ...................... 523/427 |
| 5,418,266 | * | 5/1995 | Shiobara et al. ...................... 523/443 |
| 5,567,749 | | 10/1996 | Sawamura et al. ................... 523/443 |

FOREIGN PATENT DOCUMENTS 06025384    1/1994   (JP) .

* cited by examiner

Primary Examiner—Robert Dawson
Assistant Examiner—D. Aylward
(74) Attorney, Agent, or Firm—Smith, Gambrell & Russell

(57) ABSTRACT

The present invention provides an epoxy resin composition for encapsulating a semiconductor, which has excellent flame retardancy without containing any flame retardant such as halogen type, antimony trioxide or the like. The present invention lies in an epoxy resin composition for encapsulating a semiconductor, comprising as essential components:

(A) a phenolic resin containing, in the total phenolic resin amount, 30 to 100% by weight of a phenolic resin of novolac structure containing, in the molecule, a biphenyl derivative and/or a naphthalene derivative, (B) an epoxy resin containing, in the total epoxy resin amount, 30 to 100% by weight of an epoxy resin of novolac structure containing, in the molecule, a biphenyl derivative and/or a naphthalene derivative, (C) an inorganic filler, and (D) a curing accelerator.

18 Claims, No Drawings

EPOXY RESIN COMPOSITION AND SEMICONDUCTOR DEVICE USING THE SAME

The present invention relates to an epoxy resin composition for encapsulating a semiconductor, superior in flame retardancy and reliability, as well as to a semiconductor device using the composition.

Electronic parts such as diodes, transistors, integrated circuits and the like have been encapsulated mainly with epoxy resin compositions. These epoxy resin compositions contain, as a flame retardant, a halogen-based flame retardant and antimony trioxide so that the compositions can show good flame retardancy. Meanwhile, it is requested to develop, from the standpoint of environmental sanitation, an epoxy resin composition of excellent flame retardancy using neither halogen-based flame retardant nor antimony trioxide.

For the above request, metal hydroxides (e.g. aluminum hydroxide and magnesium hydroxide) and boron compounds have been investigated. They, however, must be added in a large amount in order to show flame retardancy, and contain a large amount of impurities and have a problem in moisture resistance; therefore, they have found no practical application yet. Red phosphorus-based flame retardants are effective even when added in a small amount and are useful to obtain a flame-retardant epoxy resin composition; however, red phosphorus reacts with a very small amount of water to generate phosphine or corrosive phosphoric acid and has a problem in moisture resistance, making impossible its use in an epoxy resin composition for encapsulating a semiconductor which has a severe requirement for moisture resistance. Hence, it was tried to coat red phosphorus particles with aluminum hydroxide, a metal oxide, an inorganic compound or an organic compound (e.g. a thermosetting resin) to stabilize red phosphorus; however, such an approach still has a problem in moisture resistance. Thus, no epoxy resin composition for encapsulating a semiconductor has been developed yet which uses neither halogen-based flame retardant nor antimony trioxide but which has both flame retardancy and moisture resistance.

In view of the above situation, the present invention provides an epoxy resin composition for encapsulating a semiconductor, which is free from any flame retardant and yet superior in flame retardancy and reliability, and also a semiconductor device using the composition.

The present inventors made an intensive study in order to solve the above-mentioned problems of the prior art. As a result, the present inventors found out that use of a particular epoxy resin and a particular phenolic resin in combination can provide an epoxy resin composition for encapsulating a semiconductor which is free from any flame retardant and yet superior in flame retardancy and reliability. The present inventors also found out that the epoxy resin composition can have higher flame retardancy by controlling its reactivity. The present invention has been completed based on these findings.

The present invention provides an epoxy resin composition for encapsulating a semiconductor, comprising as essential components:

(A) a phenolic resin containing, in the total phenolic resin amount, 30 to 100% by weight of a phenolic resin of novolac structure containing, in the molecule, a biphenyl derivative and/or a naphthalene derivative, (B) an epoxy resin containing, in the total epoxy resin amount, 30 to 100% by weight of an epoxy resin of novolac structure containing, in the molecule, a biphenyl derivative and/or a naphthalene derivative, (C) an inorganic filler, and (D) a curing accelerator.

In the present epoxy resin composition for encapsulating a semiconductor, it is preferable that the ratio of the number of phenolic hydroxyl groups of total phenolic resin to the number of epoxy groups of total epoxy resin is larger than 1 but not larger than 2.

The present invention also provides a semiconductor device obtained by encapsulating a semiconductor with the above epoxy resin composition.

The present inventors found out that use of a particular epoxy resin and a particular phenolic resin in combination can provide an epoxy resin composition superior in flame retardancy and reliability and also that the epoxy resin composition can have higher flame retardancy by controlling its reactivity.

In the present invention, the particular phenolic resin refers to a phenolic resin of novolac structure containing, in the molecule, a biphenyl derivative and/or a naphthalene derivative, and the particular epoxy resin refers to an epoxy resin of novolac structure containing, in the molecule, a biphenyl derivative and/or a naphthalene derivative. They each contain, in the molecule, an aromatic ring(s) of a biphenyl derivative and/or a naphthalene derivative.

A phenolic resin or an epoxy resin each containing, in the molecule, an aromatic ring(s) of biphenyl derivative and/or naphthalene derivative has a large bond energy between molecules and hardly causes decomposition when burnt, expressing flame retardancy. As the number of aromatic rings in the molecule of the phenolic resin or the epoxy resin is larger, the resin is more resistant to combustion and has higher flame retardancy; for example, the resin containing anthracene is more resistant to combustion than the resin containing naphthalene. However, such a resin having a larger number of aromatic rings has too high a softening point and inferior flowability. Therefore, as the aromatic ring, a biphneyl derivative and a naphthalene derivative are best in view of the balance of flame retardancy and flowability.

The present epoxy resin composition can have higher flame retardancy by controlling its reactivity. That is, the present epoxy resin composition can have higher flame retardancy when the ratio of the number of phenolic hydroxyl groups of total phenolic resin to the number of epoxy groups of total epoxy resin is allowed to be larger than 1. The reason might be that in the cured resin composition, there are residual hydroxyl groups which have not reacted with epoxy groups and, when the cured resin composition is burnt, these hydroxyl groups cause a dehydration reaction (an endothermic reaction) between themselves. The ratio of the number of phenolic hydroxyl groups of total phenolic resin to the number of epoxy groups of total epoxy resin is preferably not larger than 2. The ratio of larger than 2 reduces the above-mentioned reactivity of epoxy resin composition strikingly. The ratio is more preferably 1.1 to 1.5.

In the combination of a general-purpose phenolic resin (phenolic novolac) and a general-purpose epoxy resin (o-cresol novolac type epoxy), as the ratio of the number of phenolic hydroxyl groups of total phenolic resin to the number of epoxy groups of total epoxy resin is made larger, the combination tends to have higher water absorption and lower moisture resistance. In contrast, in the combination of the particular phenolic resin and the particular epoxy resin according to the present invention, neither large increase in water absorption nor reduction in moisture resistance is seen. This is presumed to be because the particular phenolic resin and the particular epoxy resin of the present invention both have hydrophobic aromatic rings and further because in the combination of these resins, the distance between crosslinked molecules is larger than in the combination of the general-purpose phenolic resin (phenolic novlac) and the general-purpose epoxy resin (o-cresol novolac type epoxy) and resultantly no large increase in water absorption is seen.

In the present invention, the particular phenolic resin refers to a phenolic resin of novolac structure containing, in the molecule, a biphenyl derivative and/or a naphthalene derivative. The phenolic resin of novolac structure containing, in the molecule, a biphenyl derivative is specifically represented by the formula (1):

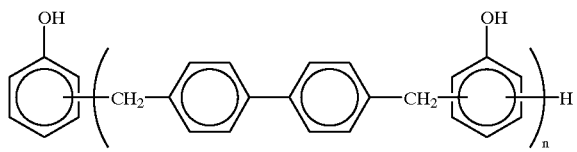
(1)

The phenolic resin represented by the formula (1) is a resin obtained by reacting phenol and e.g. a bismethoxymethyl-enebiphenyl. In the formula (1), n is 1 to 10. When n is 11 or larger, the resin has too high a viscosity and has reduced flowability. For obtaining flame retardancy, it is desired that the phenolic resin of the formula (1) is used, in the total phenolic resin amount, by 30% by weight or more, preferably 50% by weight or more. When the amount of the particular phenolic resin is less than 30% by weight, insufficient flame retardancy results.

The phenolic resin of novolac structure containing, in the molecule, a naphthalene derivative is specifically represented by the formula (3) or the formula (4) and uses α-naphthol or β-naphthol as the base.

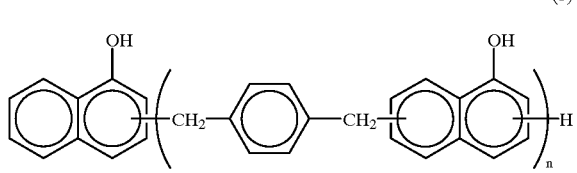
(3)

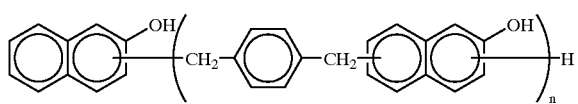
(4)

In the formula (3), n is 1 to 7. When n is 8 or larger, the resin has too high a viscosity and reduced flow-ability. For obtaining flame retardancy, it is desired that the phenolic resin of the formula (3) is used, in the total phenolic resin amount, by 30% by weight or more, preferably 50% by weight or more. When the amount of the particular phenolic resin is less than 30% by weight, insufficient flame retardancy results. In the formula (4), n is 1 to 10. When n is 11 or larger, the resin has too high a viscosity and reduced flowability. For obtaining flame retardancy, it is desired that the phenolic resin of the formula (4) is used, in the total phenolic resin amount, by 30% by weight or more, preferably 50% by weight or more. When the amount of the particular phenolic resin is less than 30% by weight, insufficient flame retardancy results.

In the present invention, besides the particular phenolic resin, other phenolic resins can be used in combination. As the other phenolic resins, there can be mentioned phenolic resins having, in the molecule, two or more phenolic hydroxyl groups, for example, phenolic novolac resin, cresol novolac resin, dicyclopentadiene-modified phenolic resin, xylylene-modified phenolic resin, terpene-modified phenolic resin and triphenolmethane type novolac resin.

In the present invention, the particular epoxy resin refers to an epoxy resin of novolac structure containing, in the molecule, a biphenyl derivative and/or a naphthalene derivative. The epoxy resin of novolac structure containing, in the molecule, a biphenyl derivative can be obtained specifically by subjecting the phenolic resin of the formula (1) to glycidyl etherification and is represented by the formula (2):

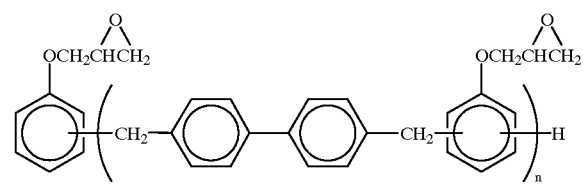
(2)

In the formula (2), n is 1 to 10. When n is 11 or larger, the resin has too high a viscosity and reduced flowability. For obtaining flame retardancy, it is desired that the epoxy resin of the formula (2) is used, in the total epoxy resin amount, by 30% by weight or more, preferably 50% by weight or more. When the amount of the particular epoxy resin is less than 30% by weight, insufficient flame retardancy results.

The epoxy resin of novolac structure containing, in the molecule, a naphthalene derivative can be obtained specifically by subjecting the phenolic resin of the formula (3) or (4) to glycidyl etherification and is represented by the formula (5) or (6):

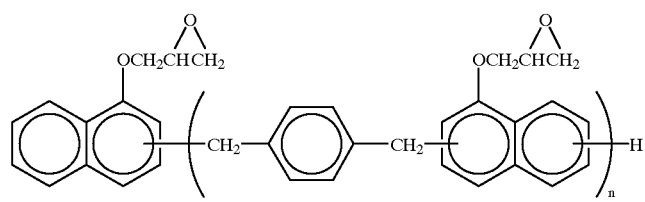
(5)

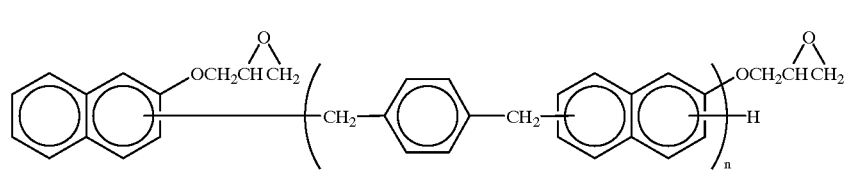
(6)

In the formula (5), n is 1 to 7. When n is 8 or larger, the resin has too high a viscosity and reduced flow-ability. For obtaining flame retardancy, it is desired that the epoxy resin of the formula (5) is used, in the total epoxy resin amount, by 30% by weight or more, preferably 50% by weight or more. When the amount of the particular epoxy resin is less than 30% by weight, insufficient flame retardancy results. In the formula (6), n is 1 to 10. When n is 11 or larger, the resin has too high a viscosity and reduced flowability. For obtaining flame retardancy, it is desired that the epoxy resin of the formula (6) is used, in the total epoxy resin amount, by 30% by weight or more, preferably 50% by weight or more. When the amount of the particular epoxy resin is less than 30% by weight, insufficient flame retardancy results.

In the present invention, besides the particular epoxy resin, other epoxy resins can be used in combination. As the other epoxy resins, there can be mentioned epoxy resins having, in the molecule, two or more epoxy groups, for example, biphenyl type epoxy resin, hydroquinone type epoxy resin, stilbene type epoxy resin, bisphenol type epoxy resin, phenolic novolac type epoxy resin, cresol novolac type epoxy resin, triphenolmethane type epoxy resin, alkyl-modified triphenolmethane type epoxy resin, triazine nucleus-containing epoxy resin, dicyclopentadiene-modified phenol type epoxy resin.

The curing accelerator used in the present invention may be a substance which accelerates the curing reaction between epoxy group and phenolic hydroxyl group. As the curing accelerator, various accelerators generally used in encapsulating materials can be used. The curing accelerator includes, for example, 1,8-diazabicyclo-(5,4,0)undecene-7, triphenylphosphine and 2-methylimidazole. These accelerators can be used singly or in admixture.

As the inorganic filler used in the present invention, various inorganic fillers generally used in encapsulating materials can be used. The inorganic filler includes, for example, fused silica powder, crystalline silica powder, alumina and silicon nitride. These fillers can be used singly or in admixture. The amount of the inorganic filler used is preferably 70 to 95% by weight of the total resin composition in view of the balance of moldability and flame retardancy. When the amount is less than 70% by weight, flame retardancy would be decreased; when the amount is more than 95% by weight, a problem arises in moldability.

The resin composition of the present invention may contain, as necessary, various additives besides the components (A) to (D). The additives include a coloring agent (e.g. carbon black), a coupling agent (e.g. γ-glycidoxypropyltrimethoxysilane), a low-stress component (e.g. silicone oil or silicone rubber), a releasing agent (e.g. natural wax, synthetic wax, higher fatty acid or metal salt thereof, or paraffin), an antioxidant, etc.

The resin composition of the present invention can be obtained by mixing the components (A) to (D), additives, etc. at room temperature by use of a mixer, kneading the resulting mixture by use of a kneader such as roll, extruder or the like, and cooling and grinding the kneaded material.

In encapsulating an electronic part (e.g. semiconductor) with the present resin composition to produce a resin-encapsulated semiconductor device, molding and curing can be conducted by a conventional method such as transfer molding, compression molding, injection molding or the like.

The resin composition of the present invention can be applied to the coating, insulation, encapsulation, etc. of electric parts or electronic parts (e.g. transistors and integrated circuits).

The present resin composition can also be applied effectively to ordinary molded products.

Examples of the present invention are shown below. However, the present invention is not restricted thereto.

The numbers and structures of the epoxy resins and phenolic resins used in Examples and Comparative Examples are shown below.

Phenolic Resin 1:

a phenolic resin represented by the formula (1) (hydroxyl group equivalent: 199 g/eg)

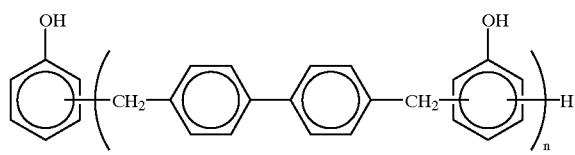

(1)

Phenolic Resin 2:

a phenolic resin represented by the formula (3) (hydroxyl group equivalent: 210 g/eq)

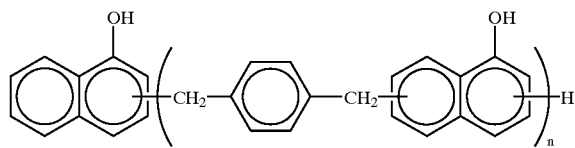

(3)

Phenolic Resin 3:

a phenolic resin represented by the formula (4) (hydroxyl group equivalent: 210 g/eq)

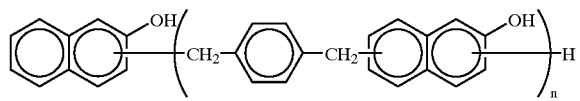

(4)

Phenolic Resin 4:

a phenolic resin represented by the formula (7) (hydroxyl group equivalent: 175 g/eq)

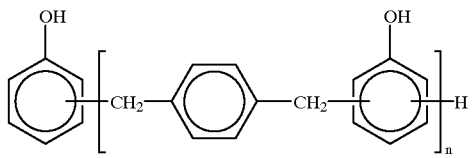

(7)

Phenolic Resin 5:

a phenolic resin represented by the formula (8) (hydroxyl group equivalent: 97 g/eq)

(8)

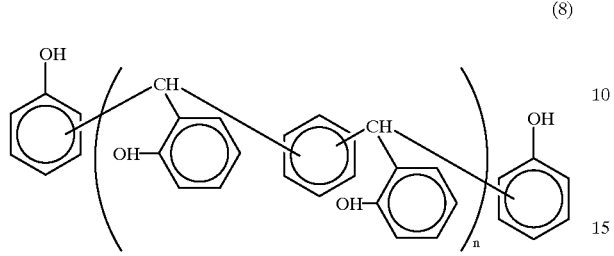

Epoxy Resin 1:

an epoxy resin composed mainly of a structure represented by the formula (2) (epoxy equivalent: 274 g/eq)

(2)

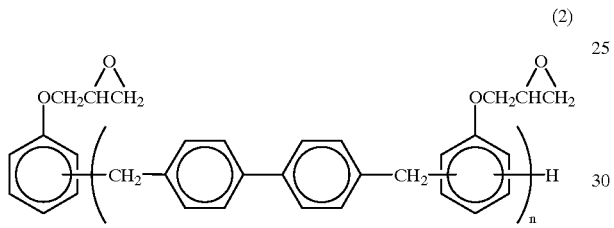

Epoxy Resin 2:

an epoxy resin composed mainly of a structure represented by the formula (5) (epoxy equivalent: 270 g/eq)

(5)

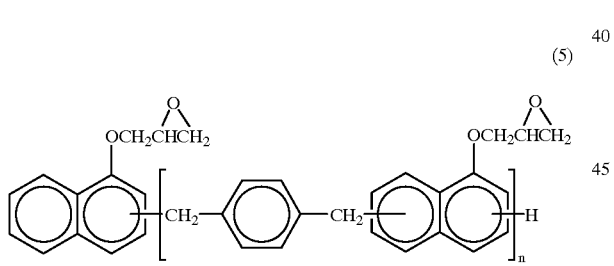

Epoxy Resin 3:

an epoxy resin composed mainly of a structure represented by the formula (6) (epoxy equivalent: 270 g/eq)

(6)

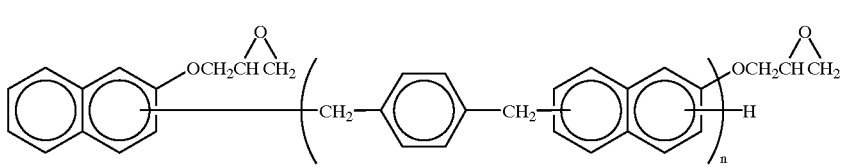

Epoxy Resin 4:

an epoxy resin composed mainly of a structure represented by the formula (9) (epoxy equivalent: 190 g/eq)

(9)

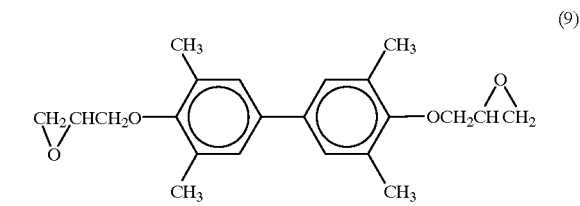

Epoxy Resin 5:

a mixture (epoxy equivalent: 210 g/eq) of 60% by weight of a resin composed mainly of 4,4'-bis(2,3-epoxypropoxy)-3,3',5,5'-tetramethylstilbene of the formula (10) and 40% by weight of a resin composed mainly of 4,4'-bis(2,3-epoxypropoxy)-5-t-butyl-2,3',5'-trimethylstilbene of the formula (11)

(10)

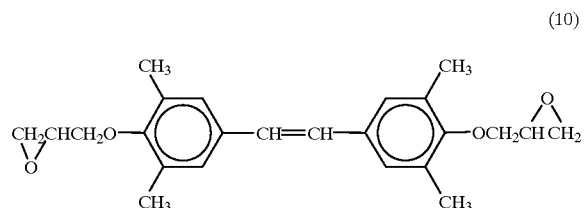

(11)

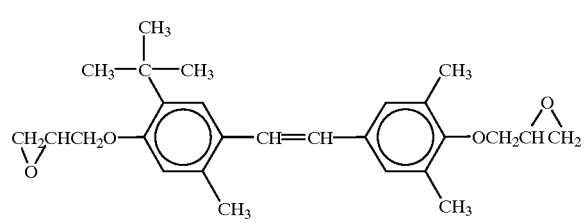

Epoxy Resin 6:

an epoxy resin composed mainly of a structure represented by the formula (12) (epoxy equivalent: 196 g/eq)

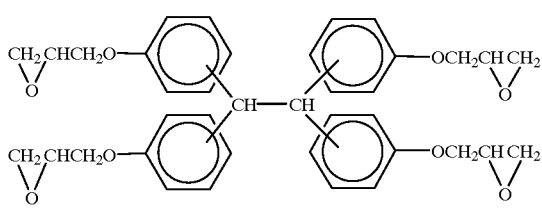

(12)

Epoxy Resin 7:

an epoxy resin composed mainly of a structure represented by the formula (13) (epoxy equivalent: 171 g/eq)

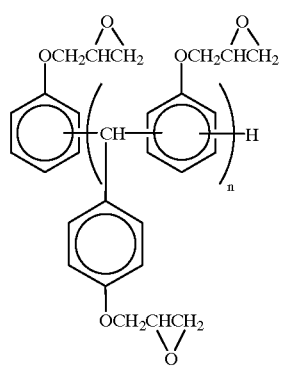

(13)

Incidentally, the phenolic novolac resin used in Examples 11 and 14 and Comparative Examples 1 to 3 and 5 to 7 had a hydroxyl group equivalent of 104 g/eq; the o-cresol novolac type epoxy resin used in Examples 9 and 11 and Comparative Examples 1 to 3 and 5 to 7 had an epoxy equivalent of 200 g/eq; and the fused spherical silica used in Examples 4 to 15 and Comparative Examples 5 to 7 had an average particle diameter of 22 μm and a specific surface area of 5.0 m²/g.

EXAMPLE 1

| | |
|---|---|
| Phenolic resin 1 | 123 parts by weight |
| Epoxy resin 1 | 170 parts by weight |
| (The ratio of the number of phenolic hydroxyl groups and the number of epoxy groups is 1.0.) | |
| Fused crushed silica (average particle diameter: 15 μm, specific surface area: 2.2 m²/g) | 700 parts by weight |

-continued

| | |
|---|---|
| Triphenylphosphine | 2 parts by weight |
| Carbon black | 2 parts by weight |
| Carnauba wax | 3 parts by weight |

The above materials were mixed at room temperature by use of a super mixer; the resulting mixture was kneaded at 70 to 100° C. by use of a roll; and the kneaded material was cooled and ground to obtain a resin composition. The resin composition was made into tablets. The tablets were passed through a low pressure transfer molding machine under the conditions of 175° C., 70 kg/cm² and 120 seconds to prepare a test piece for flame retardancy test. Also, for use in moisture resistance test, a 16p DIP on which a 3.0 mm×3.5 mm semiconductor had been mounted, was encapsulated with the above tablets. The following flame resistance test and moisture resistance test were conducted. The results of the tests are shown in Table 1.

Flame Retardancy Test

UL-94 vertical test (sample thickness: 1.6 mm)
Criteria for flame retardancy (V-0)
Fmax: not longer than 10 seconds
ΣF: not longer than 50 seconds
Fmax: maximum value of flaming time (seconds)
ΣF: total flaming time (seconds)

Moisture Resistance Test

The encapsulated semiconductor was subjected to a pressure cooker test (125° C., 100 RH %) and examined for fault of circuit. The moisture resistance of the sample was expressed by the time (hours) in which the first fault of circuit appeared in the pressure cooker test.

EXAMPLES 2 TO 15 AND COMPARATIVE EXAMPLES 1 TO 7

Resin compositions were prepared in the same manner as in Example 1, according to the formulations shown in Tables 1, 2 and 3, and subjected to the same tests as in Example 1. The results of the tests are shown in Tables 1, 2 and 3.

TABLE 1

| | Examples | | | | | | | |
|---|---|---|---|---|---|---|---|---|
| | 1 | 2 | 3 | 4 | 5 | 6 | 7 | 8 |
| Ratio of number of phenolic hydroxyl groups and number of epoxy groups | 1.0 | 1.1 | 1.5 | 1.25 | 1.25 | 1.25 | 1.25 | 1.25 |
| Phenolic resin 1 (parts by weight) | 123 | 130 | 152 | 56 | 37 | 37 | 40 | |
| Phenolic resin 2 (parts by weight) | | | | | 37 | | | 39 |

TABLE 1-continued

|  | Examples | | | | | | | |
| --- | --- | --- | --- | --- | --- | --- | --- | --- |
|  | 1 | 2 | 3 | 4 | 5 | 6 | 7 | 8 |
| Phenolic resin 3 (parts by weight) |  |  |  |  |  | 37 |  |  |
| Phenolic resin 4 (parts by weight) |  |  |  |  |  |  | 40 | 39 |
| Phenolic resin 5 (parts by weight) |  |  |  |  |  |  |  |  |
| Phenolic novolac resin (parts by weight) |  |  |  |  |  |  |  |  |
| Epoxy resin 1 (parts by weight) | 170 | 163 | 141 | 97 | 40 | 40 | 37 | 37 |
| Epoxy resin 2 (parts by weight) |  |  |  |  | 39 |  |  |  |
| Epoxy resin 3 (parts by weight) |  |  |  |  |  | 39 |  |  |
| Epoxy resin 4 (parts by weight) |  |  |  |  |  |  |  | 37 |
| Epoxy resin 5 (parts by weight) |  |  |  |  |  |  |  |  |
| Epoxy resin 6 (parts by weight) |  |  |  |  |  |  | 15 |  |
| Epoxy resin 7 (parts by weight) |  |  |  |  |  |  | 22 |  |
| o-Cresol novolac type epoxy resin (parts by weight) |  |  |  |  |  |  |  |  |
| Fused crushed silica (parts by weight) | 700 | 700 | 700 |  |  |  |  |  |
| Fused spherical silica (parts by weight) |  |  |  | 840 | 840 | 840 | 840 | 840 |
| Triphenylphosphine (parts by weight) | 2 | 2 | 2 | 2 | 2 | 2 | 2 | 2 |
| Carbon black (parts by weight) | 2 | 2 | 2 | 2 | 2 | 2 | 2 | 2 |
| Carnauba wax (parts by weight) | 3 | 3 | 3 | 3 | 3 | 3 | 3 | 3 |
| Flame retardancy | V-0 | V-0 | V-0 | V-0 | V-0 | V-0 | V-0 | V-0 |
| Σ F | 42 | 35 | 25 | 7 | 9 | 10 | 15 | 25 |
| Fmax | 7 | 6 | 4 | 2 | 3 | 4 | 6 | 7 |
| Moisture resistance | 400 | 400 | 350 | 400 | 400 | 400 | 400 | 380 |

TABLE 2

|  | Examples | | | | | | |
| --- | --- | --- | --- | --- | --- | --- | --- |
|  | 9 | 10 | 11 | 12 | 13 | 14 | 15 |
| Ratio of number of phenolic hydroxyl groups and number of epoxy groups | 1.25 | 1.25 | 1.25 | 1.25 | 1.25 | 1.25 | 1.25 |
| Phenolic resin 1 (parts by weight) |  |  | 33 | 43 | 80 | 31 | 21 |
| Phenolic resin 2 (parts by weight) | 40 |  |  |  |  |  |  |
| Phenolic resin 3 (parts by weight) |  | 32 |  |  |  |  |  |
| Phenolic resin 4 (parts by weight) | 40 |  |  |  |  |  |  |
| Phenolic resin 5 (parts by weight) |  | 32 |  | 43 |  |  | 39 |
| Phenolic novolac resin (parts by weight) |  |  | 32 |  |  | 31 |  |
| Epoxy resin 1 (parts by weight) | 25 |  | 44 | 34 | 37 | 73 | 33 |
| Epoxy resin 2 (parts by weight) |  | 45 |  |  |  |  |  |
| Epoxy resin 3 (parts by weight) |  |  |  |  |  |  |  |
| Epoxy resin 4 (parts by weight) | 24 |  |  |  | 37 | 18 |  |
| Epoxy resin 5 (parts by weight) |  | 44 |  |  |  |  | 60 |
| Epoxy resin 6 (parts by weight) |  |  |  |  |  |  |  |
| Epoxy resin 7 (parts by weight) |  |  |  | 33 |  |  |  |
| o-Cresol novolac type epoxy resin (parts by weight) | 24 |  | 44 |  |  |  |  |
| Fused crushed silica (parts by weight) |  |  |  |  |  |  |  |
| Fused spherical silica (parts by weight) | 840 | 840 | 840 | 840 | 840 | 840 | 840 |
| Triphenylphosphine (parts by weight) | 2 | 2 | 2 | 2 | 2 | 2 | 2 |
| Carbon black (parts by weight) | 2 | 2 | 2 | 2 | 2 | 2 | 2 |
| Carnauba wax (parts by weight) | 3 | 3 | 3 | 3 | 3 | 3 | 3 |
| Flame retardancy | V-0 | V-0 | V-0 | V-0 | V-0 | V-0 | V-0 |
| Σ F | 30 | 30 | 32 | 33 | 10 | 25 | 45 |
| Fmax | 8 | 8 | 6 | 7 | 3 | 6 | 8 |
| Moisture resistance | 370 | 370 | 350 | 380 | 400 | 400 | 400 |

EXAMPLE 3

|  | Comparative Examples | | | | | | |
| --- | --- | --- | --- | --- | --- | --- | --- |
|  | 1 | 2 | 3 | 4 | 5 | 6 | 7 |
| Ratio of number of phenolic hydroxyl groups and number of epoxy groups | 1.0 | 1.5 | 2.0 | 1.0 | 1.0 | 1.5 | 1.5 |
| Phenolic resin 1 (parts by weight) |  |  |  | 27 |  |  | 14 |
| Phenolic resin 4 (parts by weight) |  |  |  |  | 110 |  |  |
| Phenolic novolac resin (parts by weight) | 101 | 129 | 151 |  | 53 | 67 | 55 |
| Epoxy resin 1 (parts by weight) |  |  |  |  | 31 |  | 17 |

-continued

| | Comparative Examples | | | | | | |
|---|---|---|---|---|---|---|---|
| | 1 | 2 | 3 | 4 | 5 | 6 | 7 |
| Epoxy resin 2 (parts by weight) | | | | 125 | | | |
| o-Cresol novolac type epoxy resin (parts by weight) | 192 | 164 | 142 | | 100 | 86 | 67 |
| Fused crushed silica (parts by weight) | 700 | 700 | 700 | 700 | | | |
| Fused spherical silica (parts by weight) | | | | | 840 | 840 | 840 |
| Triphenylphosphine (parts by weight) | 2 | 2 | 2 | 2 | 2 | 2 | 2 |
| Carbon black (parts by weight) | 2 | 2 | 2 | 2 | 2 | 2 | 2 |
| Carnauba wax (parts by weight) | 3 | 3 | 3 | 3 | 3 | 3 | 3 |
| Flame retardancy | Completely burnt | Completely burnt | Completely burnt | Completely burnt | V-1 | V-1 | V-1 |
| ΣF | | | | | 80 | 70 | 65 |
| Fmax | | | | | 25 | 20 | 15 |
| Moisture resistance | 400 | 260 | 180 | 400 | 400 | 280 | 300 |

As clear from the above Examples, the semiconductor device encapsulated with the epoxy resin composition of the present invention free from any flame retardant such as halogen type, antimony trioxide or the like has excellent flame retardancy and moisture resistance.

What is claimed is:

1. An epoxy resin composition for encapsulating a semiconductor, comprising:
   (A) a phenolic resin containing, in the total phenolic resin amount, 30 to 100% by weight of a phenolic resin of novolac structure containing, in the molecule, a biphenyl derivative and/or a naphthalene derivative,
   (B) an epoxy resin containing, in the total epoxy resin amount, 30 to 100% by weight of an epoxy resin of novolac structure containing, in the molecule, a biphenyl derivative,
   (C) an inorganic filler, and
   (D) a curing accelerator,
wherein the epoxy resin composition does not contain any flame retardant.

2. The epoxy resin composition for encapsulating a semiconductor according to claim 1, wherein a ratio of the number of phenolic hydroxyl groups of total phenolic resin to the number of epoxy groups of total epoxy resin is larger than 1 but not larger than 2.

3. The epoxy resin composition for encapsulating a semiconductor according to claim 1, wherein the phenolic resin of novolac structure containing, in the molecule, a biphenyl derivative is represented by the formula (1):

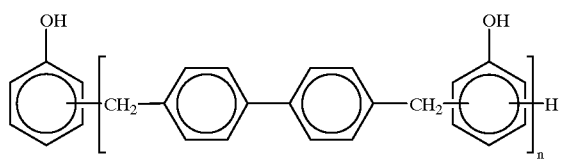

(1)

wherein n=1–10.

4. The epoxy resin composition for encapsulating a semiconductor according to claim 1, wherein the epoxy resin of novolac structure containing, in the molecule, a biphenyl derivative is represented by the formula (2):

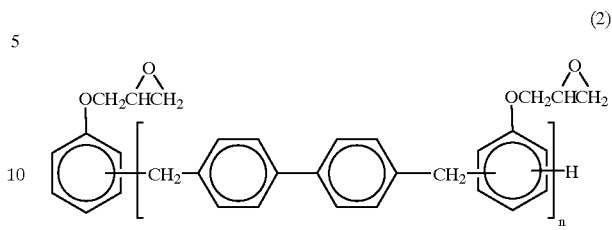

(2)

wherein n=1–10.

5. The epoxy resin composition for encapsulating a semiconductor according to claim 1, wherein the phenolic resin of novolac structure containing, in the molecule, a naphthalene derivative is represented by the formula (3):

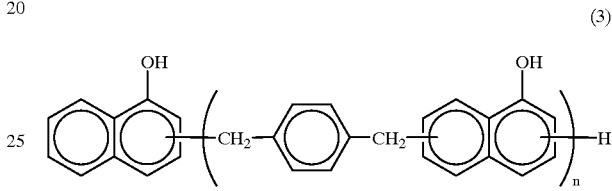

(3)

wherein n=1–7.

6. The epoxy resin composition for encapsulating a semiconductor according to claim 1, wherein the phenolic resin of novolac structure containing, in the molecule, a naphthalene derivative is represented by the formula (4):

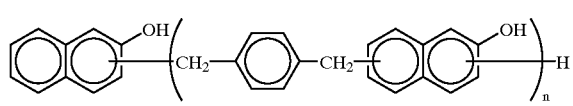

(4)

wherein n=1–10.

7. A semiconductor device obtained by encapsulating a semiconductor with an epoxy resin composition set forth in claim 1.

8. An epoxy resin composition for encapsulating a semiconductor, consisting essentially of:
   (A) a phenolic resin containing, in the total phenolic resin amount, 30 to 100% by weight of a phenolic resin of novolac structure containing, in the molecule, a biphenyl derivative and/or a naphthalene derivative,
   (B) an epoxy resin containing, in the total epoxy resin amount, 30 to 100% by weight of an epoxy resin of novolac structure containing, in the molecule, a biphenyl derivative,
   (C) an inorganic filler, and
   (D) a curing accelerator.

9. The epoxy resin composition for encapsulating a semiconductor according to claim 8, wherein a ratio of the number of phenolic hydroxyl groups of total phenolic resin to the number of epoxy groups of total epoxy resin is larger than 1 but not larger than 2.

10. The epoxy resin composition for encapsulating a semiconductor according to claim 8, wherein the phenolic resin of novolac structure containing, in the molecule, a biphenyl derivative is represented by the formula (1):

(1)

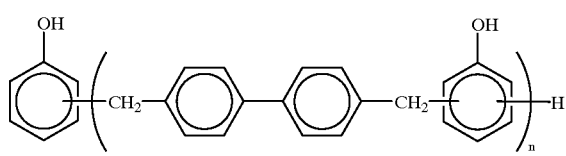

wherein n=1–10.

11. An epoxy resin composition for encapsulating a semiconductor according to claim 8, wherein the epoxy resin of novolac structure containing, in the molecule, a biphenyl derivative is represented by the formula (2):

(2)

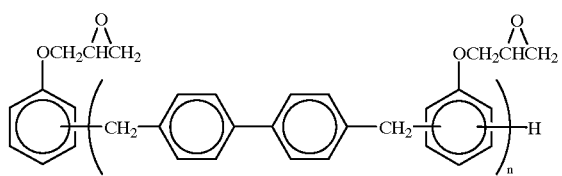

wherein n=1–10.

12. An epoxy resin composition for encapsulating a semiconductor according to claim 8, wherein the phenolic resin of novolac structure containing, in the molecule, a naphthalene derivative is represented by the formula (3):

(3)

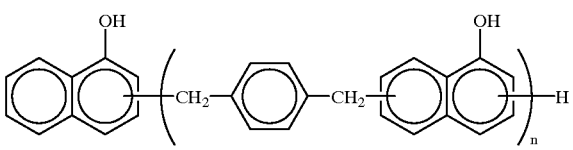

wherein n=1–7.

13. The epoxy resin composition for encapsulating a semiconductor according to claim 8, wherein the phenolic resin of novolac structure containing, in the molecule, a naphthalene derivative is represented by the formula (4):

(4)

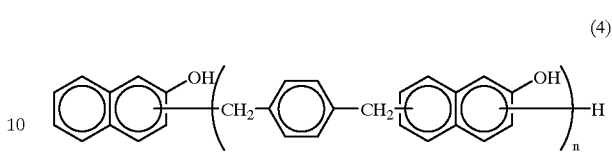

wherein n=1–10.

14. A semiconductor device obtained by encapsulating a semiconductor with an epoxy resin composition set forth in claim 8.

15. The epoxy resin composition for encapsulating a semiconductor according to claim 1, wherein the composition does not contain brominated epoxy resin, and the composition does not contain antimony trioxide.

16. The epoxy resin composition for encapsulating a semiconductor according to claim 8, wherein the composition does not contain brominated epoxy resin, and the composition does not contain antimony trioxide.

17. The epoxy resin composition for encapsulating a semiconductor according to claim 1, wherein the inorganic filler is at least one member selected from the group consisting of fused crushed silica, fused spherical silica, fused silica powder, crystalline silica powder, alumina and silicon nitride.

18. The epoxy resin composition for encapsulating a semiconductor according to claim 8, wherein the inorganic filler is at least one member selected from the group consisting of fused crushed silica, fused spherical silica, fused silica powder, crystalline silica powder, alumina and silicon nitride.

\* \* \* \* \*